US 7,843,280 B2

(12) United States Patent
Ahn et al.

(10) Patent No.: US 7,843,280 B2
(45) Date of Patent: *Nov. 30, 2010

(54) SYSTEMS, METHODS, AND APPARATUSES FOR HIGH POWER COMPLEMENTARY METAL OXIDE SEMICONDUCTOR (CMOS) ANTENNA SWITCHES USING BODY SWITCHING AND SUBSTRATE JUNCTION DIODE CONTROLLING IN MULTISTACKING STRUCTURE

(75) Inventors: Minsik Ahn, Atlanta, GA (US);
Chang-Ho Lee, Marietta, GA (US);
Jaejoon Chang, Duluth, GA (US);
Wangmyong Woo, Cumming, GA (US);
Haksun Kim, Daejeon (KR); Joy Laskar, Marietta, GA (US)

(73) Assignees: Samsung Electro-Mechanics Company, Gyunggi-Do (KR); Georgia Tech Research Corporation, Atlanta, GA (US)

( * ) Notice: Subject to any disclaimer, the term of this patent is extended or adjusted under 35 U.S.C. 154(b) by 433 days.

This patent is subject to a terminal disclaimer.

(21) Appl. No.: 11/943,378

(22) Filed: Nov. 20, 2007

(65) Prior Publication Data
US 2008/0129642 A1 Jun. 5, 2008

Related U.S. Application Data

(60) Provisional application No. 60/868,172, filed on Dec. 1, 2006.

(51) Int. Cl.
*H01P 1/15* (2006.01)
*H04B 1/44* (2006.01)
(52) U.S. Cl. .................... 333/103; 333/101; 455/78
(58) Field of Classification Search ............... 333/101, 333/103, 104, 262; 327/365, 534; 455/78
See application file for complete search history.

(56) References Cited

U.S. PATENT DOCUMENTS 5,461,265 A 10/1995 Kunihisa et al.
5,617,055 A 4/1997 Confalonieri et al.

(Continued)

FOREIGN PATENT DOCUMENTS

| CN | 1689241 A | 10/2005 |
|----|-----------|---------|
| GB | 2442848 A | 4/2008 |
| JP | 08237166 A | 9/1996 |
| WO | WO9508868 A1 | 3/1995 |

OTHER PUBLICATIONS

United Kingdom International Search Report for GB0719303.0 dated Jan. 24, 2008.

(Continued)

*Primary Examiner*—Dean O Takaoka
(74) *Attorney, Agent, or Firm*—Sutherland Asbill & Brennan LLP

(57) ABSTRACT

Embodiments of the invention may provide for a CMOS antenna switch, which may be referred to as a CMOS SPDT switch. The CMOS antenna switch may operate at a plurality of frequencies, perhaps around 900 MHz 1.9 GHz and 2.1 GHz according to an embodiment of the invention. The CMOS antenna switch may include both a receiver switch and a transmit switch. The receiver switch may utilize a multi-stack transistor with body substrate switching and source and body connection along with body floating technique to block high power signals from the transmit path by preventing channel formation of the device in OFF state as well as to maintain low insertion loss at the receiver path. Example embodiments of the CMOS antenna switch may provide for 35 dBm P 1 dB at both bands (e.g., 900 MHz and 1.9 GHz and 2.1 GHz). In addition, a −60 dBc second and third harmonic up to 28 dBm input power to the switch, may be obtained according to example embodiments of the invention.

18 Claims, 10 Drawing Sheets

U.S. PATENT DOCUMENTS

| | | | |
|---|---|---|---|
| 5,818,099 | A | 10/1998 | Bougharz |
| 6,094,088 | A | 7/2000 | Yano |
| 6,396,325 | B2 | 5/2002 | Goodell |
| 6,788,957 | B1 | 9/2004 | Recouly et al. |
| 6,836,172 | B2 * | 12/2004 | Okashita .................... 327/382 |
| 6,882,829 | B2 | 4/2005 | Mostov et al. |
| 7,092,677 | B1 | 8/2006 | Zhang et al. |
| 7,233,775 | B2 | 6/2007 | De Graauw |
| 7,659,770 | B2 * | 2/2010 | Teraguchi et al. .......... 327/534 |
| 2003/0090313 | A1 | 5/2003 | Burgener et al. |
| 2004/0214535 | A1 | 10/2004 | Khorram |
| 2006/0119451 | A1 | 6/2006 | Chen |
| 2006/0141943 | A1 | 6/2006 | De Graauw |
| 2006/0194558 | A1 | 8/2006 | Kelly |
| 2006/0199563 | A1 | 9/2006 | Kelly et al. |
| 2006/0252394 | A1 | 11/2006 | Suwa et al. |
| 2007/0049237 | A1 | 3/2007 | Miura et al. |
| 2008/0079653 | A1 | 4/2008 | Ahn et al. |
| 2008/0129642 | A1 | 6/2008 | Ahn et al. |
| 2008/0247338 | A1 | 10/2008 | Kim et al. |
| 2010/0001351 | A1 * | 1/2010 | Zhang et al. ................ 257/392 |

OTHER PUBLICATIONS

United Kingdom International Search Report for GB0723464.4 dated Feb. 28, 2008.

United Kingdom International Search Report for GB0710606.5, dated Sep. 27, 2007.

Mei-Chao Yeh, et al. "A Miniature Low-Insertion-Loss, High-Power CMOS SPDT Switch Using Floating-Body Technique for 2.4- and 5.8- GHz Applications." IEEE Xplore. May 7, 2009, p. 451-454.

Niranjan A. Talwalkar, et al. "Integrated CMOS Transmit-Receive Switch Using LC-Tuned Substrate Bias for 2.4- and 5.2-GHz Applications." IEEE Xplore. May 8, 2009, p. 863-870.

Minsik Ahn et al. "A high-power CMOS switch using a novel adaptive voltage swing distribution method in multistack FETs", IEEE Trans. on Microwave Theory and Techniques, vol. 56, No. 4, pp. 849-858, Apr. 2008.

Mei-Chao Yeh et al. "Design and analysis for a miniature CMOS SPDT switch using body-floating technique to improve performance", IEEE Transactions on Microwave Theory and Techniques, vol. 54 No. 1, pp. 31-39, Jan. 2006.

Feng-Jung Huang et al. "Single-pole double-throw CMOS switches for 900-MHz and 2.4-GHz applications on p- silicon substrates", IEEE Journal of Solid-State Circuits, vol. 39, No. 1, pp. 35-41, Jan. 2004.

C. Tinella et al. "0.13 μm CMOS SOI SP6T Antenna Switch for Multi-Standard Handsets," Dig. SiRF, pp. 58-61, Jan. 2006.

Karl Goser, Großintegrationstechnik—Teil 1: Vom Transistor zur Grundschaltung. Heidelberg: Hüthig, 1990, S. 99-10. ISBN: 3-7785-1615-9.

Combined Search and Examination Report for GB0816744.7 mailed Jan. 12, 2009.

Office Action dated Jan. 19, 2010 for German Patent Application No. 102008046778.2.

Office Action dated Nov. 11, 2008 for German Patent Application No. 102007046883.2.

Office Action mailed on Jul. 23, 2009 for Korean Patent Application No. 10-2007-0099372.

Notice of Allowance dated Mar. 10, 2010 for U.S. Appl. No. 11/855,950.

Non-Final Office Action dated Jan. 26, 2010 for U.S. Appl. No. 11/857,322.

Neil H.E. Weste et al. "Principles of CMOS VLSI Design: A Systems Perspective." Reading, MA: Addison-Wesley Publishing Company. pp. 89-93.

Office Action dated Jan. 15, 2010 for German Patent Application No. 102007057656.2.

Office Action for Chinese Patent Application No. 200710163832.5 dated May 11, 2010.

Final Office Action for U.S. Appl. No. 11/857,322 dated Jul. 7, 2010.

* cited by examiner

SYSTEMS, METHODS, AND APPARATUSES FOR HIGH POWER COMPLEMENTARY METAL OXIDE SEMICONDUCTOR (CMOS) ANTENNA SWITCHES USING BODY SWITCHING AND SUBSTRATE JUNCTION DIODE CONTROLLING IN MULTISTACKING STRUCTURE

RELATED APPLICATION

The present application claims priority to U.S. Provisional Application No. 60/868,172, filed Dec. 1, 2006, and entitled "Systems, Methods, and Apparatuses for High Power Complementary Metal Oxide Semiconductor (CMOS) Antenna Switches Using Body Switching and Substrate Junction Diode Controlling in Multistacking Structure," which is hereby incorporated by reference in its entirety.

FIELD OF THE INVENTION

Embodiments of the invention relate generally to antenna switches, and more particularly, to complementary metal oxide semiconductor (CMOS) antenna switches.

BACKGROUND OF THE INVENTION

In the past decade, the wireless communication industry has experienced explosive growth, which has in turn accelerated the development of integrated circuit (IC) industry. In particular, in the IC industry, many mobile application systems like low noise amplifiers (LNAs), mixers, and voltage-controlled oscillators (VCOs) have been integrated into CMOS technology. Two significant mobile application components—power amplifiers (PAs) and radio frequency (RF) switches—have not yet been commercially integrated into CMOS technology.

However, IC industry research is quickly moving towards power amplifier integrated into CMOS technology. For example, current research indicates that a CMOS power amplifier may be feasible and be able to provide a significant amount of power, perhaps up to 2 Watts (W), for mobile communications. Accordingly, when the power amplifier becomes integrated into CMOS technology, there will be a need for an RF switch integrated into CMOS technology.

However, current CMOS technology presents a variety of difficulties for its application to RF switches. In particular, CMOS material characteristics, including lossy substrates due to low mobility of electrons and low breakdown voltages due to p-n junction, hot carrier effects, have prevented CMOS technology from being used for RF switches that require multi-band operation, high power levels, and/or integration with other devices and circuits.

BRIEF SUMMARY OF THE INVENTION

Embodiments of the invention may provide for CMOS radio frequency (RF) switches, which may be referred to as a CMOS SPDT switch. According to an embodiment of the invention, the CMOS RF switch may be fabricated using a standard 0.18 um process, although other processes may be utilized without departing from embodiments of the invention. In order to provide high power handling capability in a multi-band operation (e.g., about 900 MHz, 1.9 GHz, 2.1 GHz, etc.) of the CMOS RF switch, multi-stacked transistors with substrate body switching and source or drain-to-bulk connection may be applied to the receiver switch. According to an embodiment of the invention, the CMOS RF switch may provide higher power blocking capability and lower leakage current toward the receiver switch at the transmission (Tx) mode as well as low insertion loss at the reception (Rx) mode at multi-band (e.g., 900 MHz, 1.9 GHz, 2.1 GHz, and the like).

According to an example embodiment of the invention, there is a CMOS antenna switch. The CMOS antenna switch may include an antenna operative at a plurality RF bands, a transmit switch in communication with the antenna, and a receiver switch in communication with the antenna, where the receiver switch includes a plurality of transistors, including a first transistor and a second transistor, where the first transistor includes a first source, a first drain, and a first body substrate, wherein the second transistor includes a second source, a second drain, and a second body substrate, where the first body substrate is electrically connected to the first source or the first drain, and where the second body substrate is selectively connectable between a resistance and ground.

According to another embodiment of the invention, there is a method for a CMOS antenna switch. The method may include providing an antenna operative at a plurality of RF bands, and electrically connecting a transmit switch and a receiver switch to the antenna, where the receiver switch comprises a plurality of transistors, including a first transistor and a second transistor, where the first transistor includes a first source, a first drain, and a first body substrate, and where the second transistor includes a second source, a second drain, and a second body substrate. The method may also include electrically connecting the first body substrate to the first source or the first drain, and selectively connecting the second body substrate between a resistance and ground.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

The invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for complementary metal oxide semiconductor (CMOS) radio frequency (RF) antenna switches, which may also be referred to as SPDT CMOS switches. The CMOS RF antenna switches in accordance with embodiments of the invention may provide for one or more of multi-band operation, high power handling, and integration with other devices and circuits. Generally, the CMOS RF antenna switch may include a receiver switch and a transmit switch. The receiver switch may utilize one or more switching substrate body and source or drain-to-bulk connection with body floating technique, as will be described in further detail below. In addition, the transmit switch may utilize a substrate body tuning technique, as will also be described in further detail below.

I. An Embodiment of a CMOS RF Antenna Switch

Figure 2A:
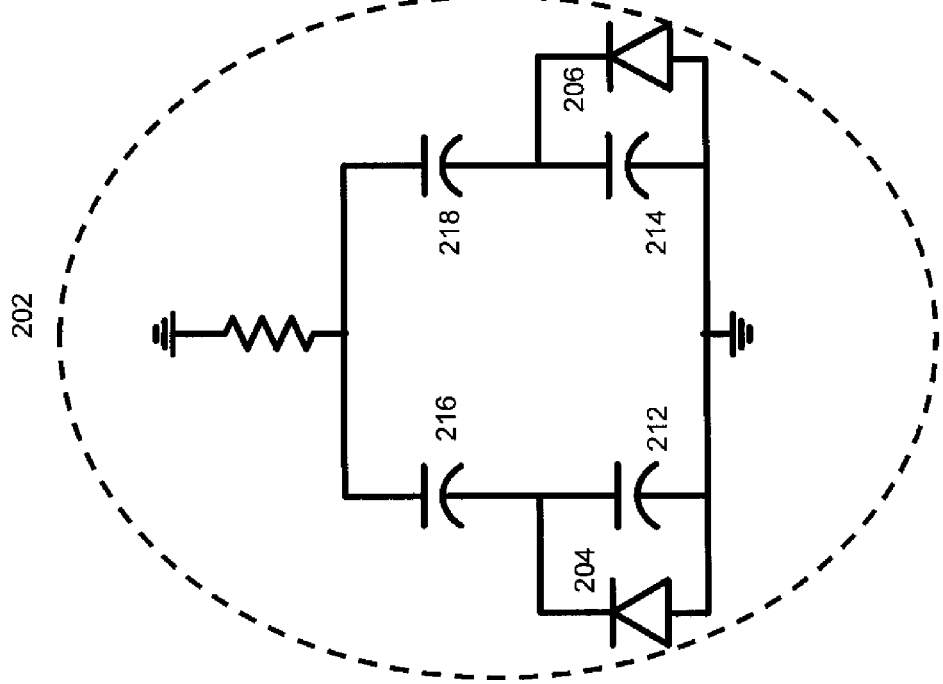
FIG. 2A illustrates an equivalent lumped model of a body floating transistor at OFF state, according to an example embodiment of the invention.
Figure 2B:
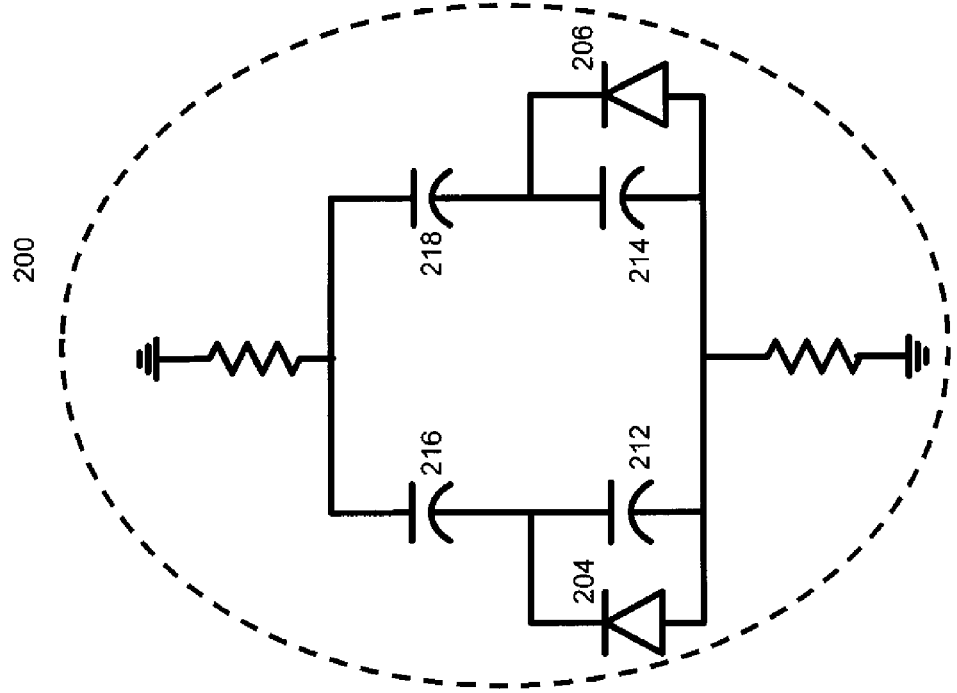
FIG. 2B illustrates an equivalent lumped model of a body grounded transistor at OFF state, according to an example embodiment of the invention.
Figure 3:
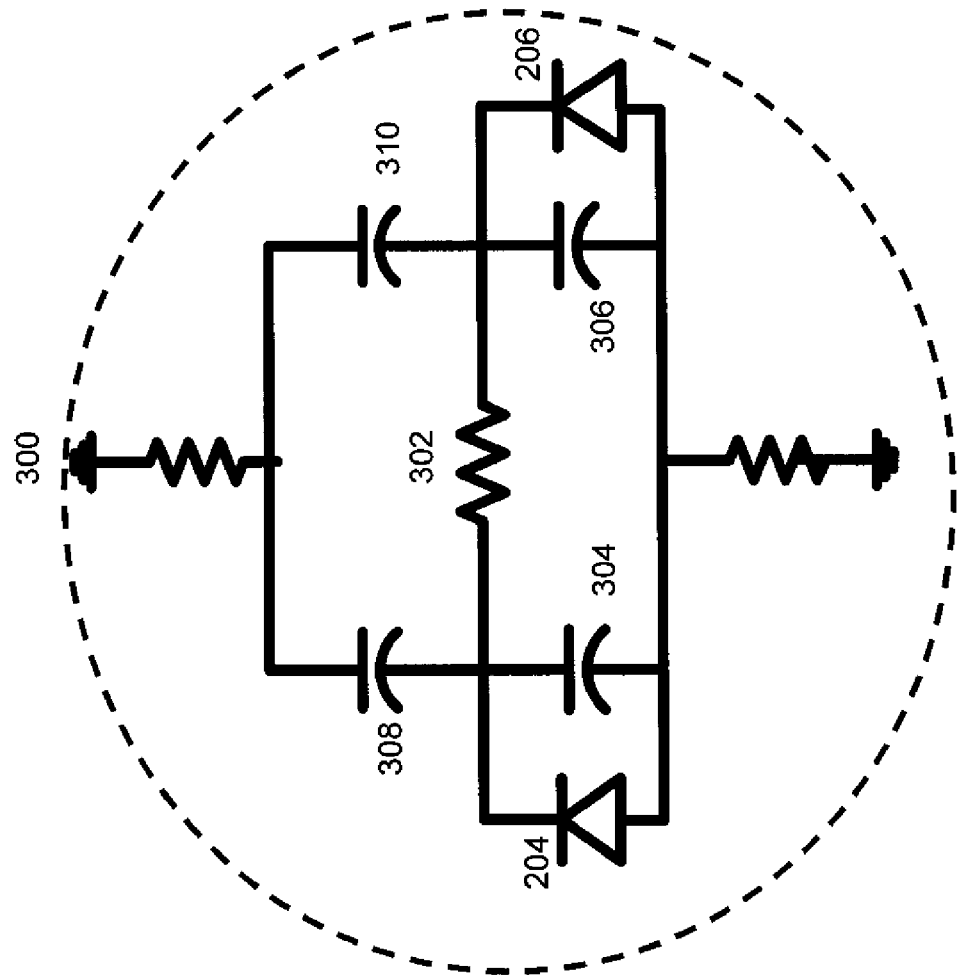
FIG. 3 illustrates an equivalent lumped model of body floating transistor at ON state, according to an example embodiment of the invention.

A CMOS RF antenna switch in accordance with an embodiment of the invention will be now be described with reference to FIGS. 1-3. It will be appreciated that while a particular embodiment of the CMOS RF antenna switch is illustrated in FIGS. 1-3, other variations of the illustrated CMOS RF antenna switch are available without departing from an embodiment of the invention.

Figure 1A:
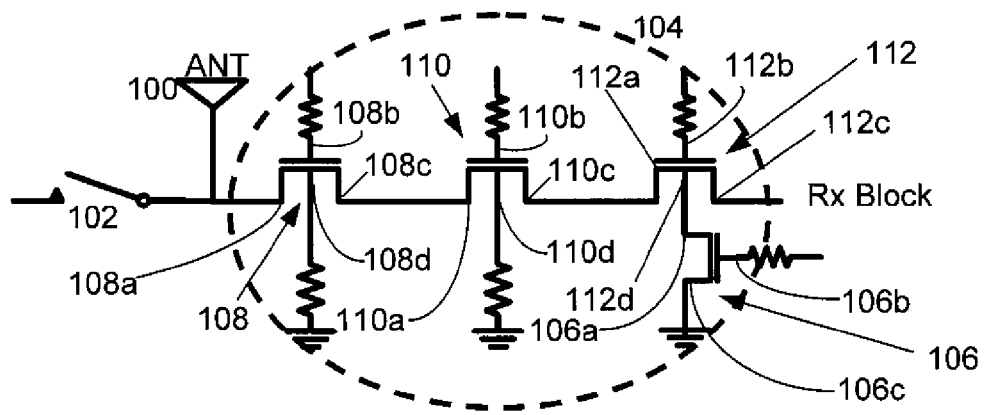
FIGS. 1A, 1B and 1C illustrate simplified example operations of a receiver switch in accordance with an example embodiment of the invention.

FIG. 1A illustrates a simplified CMOS RF antenna switch and its operation in accordance with an example embodiment of the invention. The CMOS RF antenna switch may include a transmit switch 102 and a receiver switch 104, in accordance with an example embodiment of the invention. Additionally, CMOS RF antenna switch may include an antenna 100 that is in communication with at least one of the transmit switch 102 and the receiver switch 104. According to an example embodiment of the invention, the antenna 100 may be a single multi-mode (e.g., RX and TX), multi-band antenna, although a plurality of distinct antennas may be utilized according to other embodiments of the invention. The receiver switch 104 may be comprised of cascaded or stacked transistors 108, 110, 112, and 106, which may be Complementary Metal Oxide Semiconductor (CMOS) transistors, according to an example embodiment of the invention. The transistor 108 may include a source 108a, a gate 108b, a drain 108c, and a body substrate 108d. The transistor 110 may include a source 110a, a gate 110b, a drain 110c, and a body substrate 110d. The transistor 112 may include a source 112a, a gate 112b, a drain 112c, and a body substrate 112d. The transistor 106, may include a source 106a, a gate 106b, a drain 106c, and a body substrate (not shown).

The transistor 108 may have its drain 108c connected to the source 110a of transistor 110. In addition, the transistor 110 may have its drain 110c connected to the source of transistor 112a. The drain 112c of transistor 112 may be connected to the receive (RX) block to processes received signals from the antenna 100. Additionally, the body substrate 112a of the transistor 112 may be connected to the source 106a of the transistor 106. The drain 106c of the transistor 106 may be connected to ground. As will be described in further detail, at least one transistor 106, which may operate as a substrate body switch for transistor 112, may be provided at the substrate body 112d in accordance with an example body switching technique. In particular, the at least one transistor 106 may be switched to an ON state or an OFF state, depending on whether depending on whether a respective transmit (Tx) mode or receive (Rx) mode is in operation. As will be described in further detail below in accordance with an example embodiment of the invention, the receiver switch 104 of FIG. 1A may yield different equivalent circuits depending on whether the receiver switch 104 is in an OFF state, as illustrated in FIG. 1B, or an ON state, as illustrated in FIG. 1C.

A. Transmit Mode

Figure 1B:
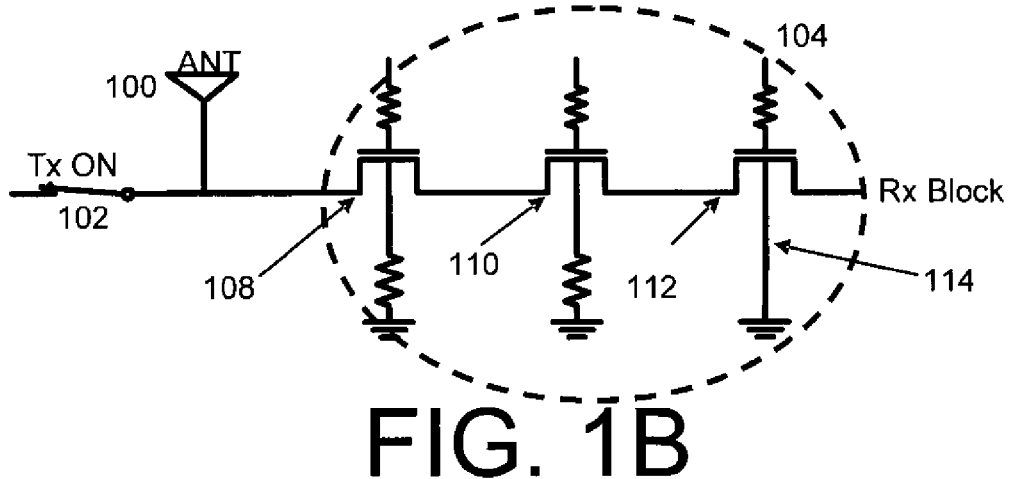
Figure 1C:
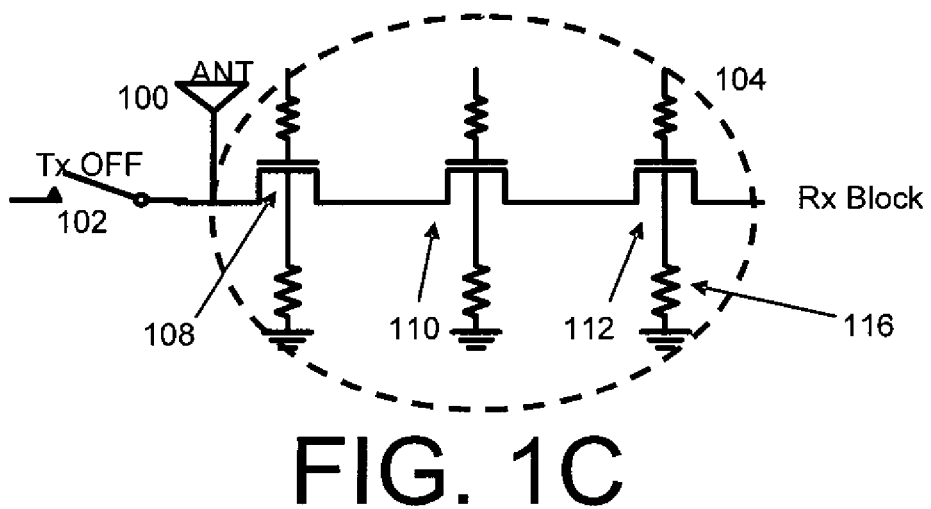

FIG. 1B illustrates an equivalent circuit of the receiver switch 104 in an OFF (e.g., disabled, block, etc.) state, according to an example embodiment of the invention. In FIG. 1B, the receiver switch 104 may be placed in the OFF state in order to provide isolation from the transmit switch 102. With the receiver switch 104 in the OFF state, a transmit signal may be provided from a transmit (Tx) block to the antenna 100. As shown in FIG. 1B, when the receiver switch 104 is in an OFF state, the stacked transistors 108, 110, 112 may then be placed in an OFF state (e.g., opened), thereby providing a higher impedance. The stacked transistor 106 may placed in an ON state 114 (e.g., closed), thereby shorting the substrate body 112d of transistor 112 to ground, and reducing the signal paths for leakage current to travel from source 112a to drain 112c.

In the configuration of FIG. 1B, the power of the transmit (Tx) signal may be maximized (and maximizing the power handling capability of the Tx block). The power handling capability of the transmit switch 102 may be determined by controlling leakage current directed towards the OFF-state receiver switch 104 as well as the source-to-drain breakdown voltage of cascaded switches 108, 110, and 112 of the receiver switch 104. Thus, the maximum transmit power of the transmit switch 102 may be dependent upon the characteristics of the receiver switch 104.

It will be appreciated that in order to increase the power handling capability of the Tx switch 102, the number of multi-stacked transistors 108, 110, 112 may be increased to reduce the breakdown burden of each transistor 108, 110, 112. For example, more than three transistors 108, 110, and 112 may be cascaded, according to another embodiment of the invention. Furthermore, it will be appreciated that the last transistor 112 from the antenna 112 can control leakage current at the receiver switch 104. If the leakage current toward OFF-state switches 108, 110, and 112 in the Rx path is minimized, then maximum power may be delivered from the Tx block to the antenna 100. As described above, the body switching transistor 106 that is connected between ground and the body substrate 112d of transistor 112 may be used to control leakage current at the receiver switch 104. More particularly, by placing the body switching transistor 106 in the ON state 114, the substrate body 112d of the last transistor 112 from the antenna 100 to the Rx block can be grounded, thereby reducing the signal paths for leakage current to travel from source 112a to drain 112c.

Still referring to FIG. 1B, when the receiver switch 104 is in the OFF position, the stacked transistors 108, 110 may be body-floating transistors while stacked transistor 112 may be a body-grounded transistor. FIG. 2A illustrates an equivalent lumped model of a body floating transistor at an OFF state 200 such as transistors 108, 110 in FIG. 1B, according to an example embodiment of the invention. FIG. 2B illustrates an equivalent lumped model of a body floating transistor at an OFF state 202 such as transistor 112 in FIG. 1B, according to an example embodiment of the invention. The equivalent models in FIGS. 2A and 2B include capacitors 212, 214, 216, 218 as well as p-n junction diodes 204, 206, according to an example embodiment of the invention.

When a voltage swing at the antenna 100 is received by the receiver switch 104, the voltage swing may be divided among stacked transistors 108, 110, and 112. Accordingly, the last transistor 112 may only experience only one third of the full voltage swing at the antenna, thereby reducing the possibility of a source-to-drain breakdown voltage occurring for transistor 112. It will be appreciated, however, that the voltage swing at the last transistor 112 may be different, and perhaps smaller, if additional preceding transistors are provided according to other embodiments of the invention to reduce the burden of the stacked transistors 108, 110, 112.

The transistors 108, 110 may be body floating transistors, as illustrated in FIG. 2A. However, in order to reduce the leakage current towards the Rx block and maximize the power handling of the Tx block to the antenna 100, the body switching transistor 106 can be put in the ON position 114 to connect the substrate body 112d to ground. Accordingly, the transistor 112 may be a body grounded transistor, as illustrated in FIG. 2B, which reduces the signal paths for leakage current to travel from source 112a to drain 112c.

When a negative voltage swing is applied to the receiver switch 104, the p-n junction diodes 204, 206 of the transistor 112 may turn on so that leakage current may occur by the current passing through the p-n junction diodes 204, 206. An issue with the p-n junction diode 204, 206 turning on may be the possible clipping of the negative voltage swing so that power handling capability of the Tx block to the antenna 100 can be limited. However, this leakage current generated by channel formation of the device 112 in OFF state is prevented because the voltage level at 112a is fixed by the turning on voltage of the p-n junction diode 204. Indeed, the multi-stacked transistors 108, 110, and 112 at OFF-state can divide the voltage swing at antenna port so that the last OFF-state transistor 112, and thus, p-n junction diodes 204, 206, may experience only one third of voltage swing at antenna 100. Thus, the overall voltage swing at antenna port may not be sufficient to turn the p-n junction diodes 204, 206 on at the last transistor 112.

B. Receive Mode

FIG. 1C illustrates an equivalent circuit of the receiver switch 104 in an ON (e.g., enable, receive, etc.) state, according to an example embodiment of the invention. In FIG. 1C, the receiver switch 104 may be placed in the ON position in order for the receive (RX) block to receive a signal from the antenna 100. With the receiver switch 104 in the ON state, the transmit switch 102 may be placed in the OFF (e.g., disabled, block) state to isolate the transmit switch 102 from the receiver switch 104. As shown in FIG. 1C, when the receiver switch 104 is in an ON state, the stacked transistor 106 may be placed in an OFF state 116, thereby providing an equivalent resistor between the body substrate 112d of transistor 112 and ground (i.e., body floating). In this way, the insertion loss at the receive (Rx) path from the antenna 100 to the RX block may be minimized.

FIG. 3 illustrates an equivalent lumped model of body floating transistor at ON state 300, according to an example embodiment of the invention. As described above, the transistor 106 may be provided in an OFF position 116 to provide a body floating transistor, as illustrated by the equivalent lumped model of FIG. 3. In FIG. 3, as the size of the transistor 112 increases, the parasitic capacitors 304, 306, 308, 310 may provide another signal path at the ON 300 state. More specifically, the ON state transistor of FIG. 3 may have an ON-resistor 302, a gate-drain capacitor 308 to gate-source capacitor 310, and a drain-body capacitor 304, and body-source capacitor 306 as signal paths. If the body substrate were grounded, then one of these signal paths through capacitors 304, 306 may be lost, thereby increasing the insertion loss. Accordingly, when the receiver switch 104 is in the ON state, the last transistor 112 need to be in body floating state (e.g., with transistor 106 in the ON state 116) to ensure minimized insertion loss.

II. A Second Embodiment of a CMOS RF Antenna Switch

An alternative embodiment of a CMOS RF antenna switch with additional harmonic performance and/or power handling capability will now be discussed with reference to FIGS. 4A-4C and 5. Generally, a CMOS RF antenna switch in accordance with an example embodiment of the invention may include source-to-bulk or drain-to-bulk electrical connections.

Figure 4A:
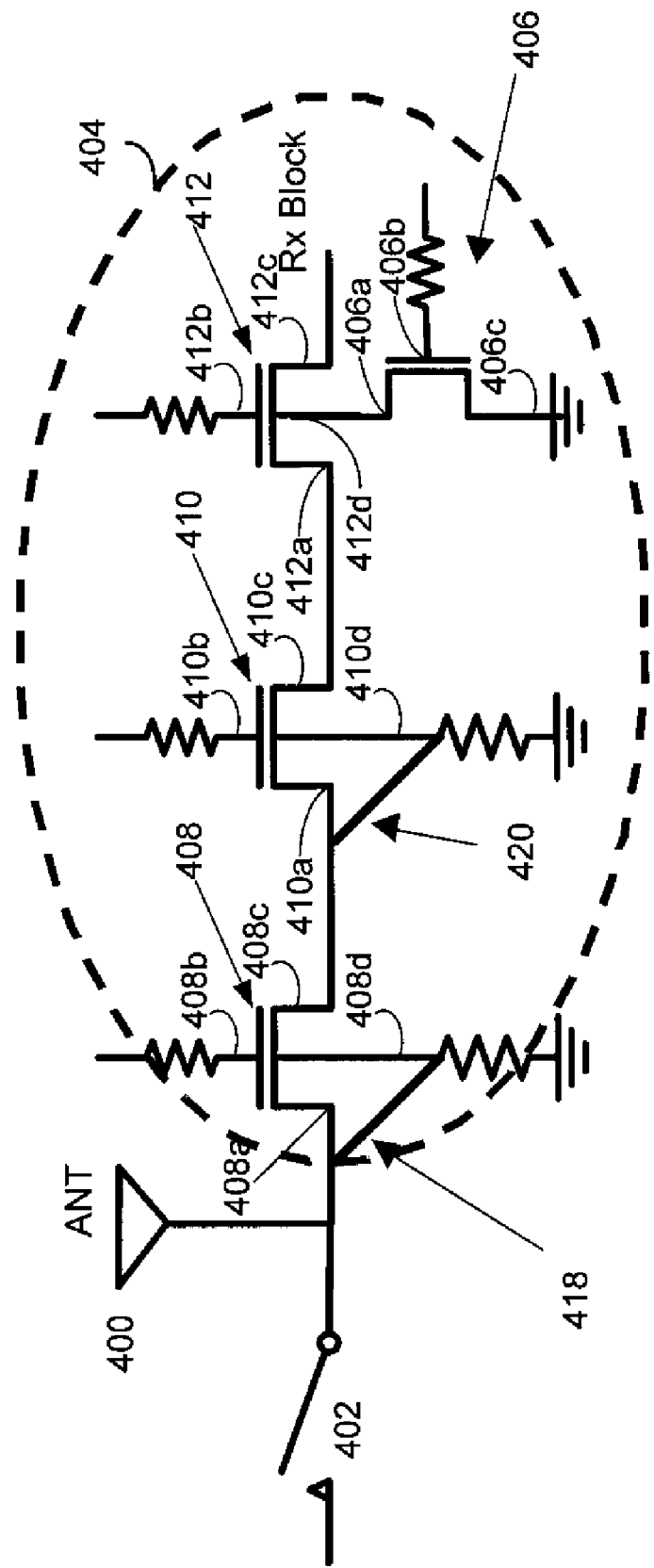
FIGS. 4A, 4B and 4C illustrate simplified operations of another example receiver switch in accordance with an embodiment of the invention

FIG. 4A illustrates simplified operations of another example receiver switch 404 in accordance with an embodiment of the invention. In particular, the receiver switch 400 may include cascaded or stacked transistors 408, 140, 142, and 406, which may be CMOS transistors, according to an example embodiment of the invention. The transistor 408 may include a source 408a, a gate 408b, a drain 408c, and a body substrate 408d. The transistor 410 may include a source 410a, a gate 410b, a drain 410c, and a body substrate 410d. The transistor 412 may include a source 412a, a gate 412b, a drain 412c, and a body substrate 112d. The transistor 106, may include a source 106a, a gate 106b, a drain 106c, and a body substrate (not shown).

The transistor 408 may have its drain 408c connected to the source 410a of transistor 410. In addition, the transistor 410 may have its drain 410c connected to the source of transistor 412a. The drain 412c of transistor 412 may be connected to the receive (RX) block to processes received signals from the antenna 400. Additionally, the body substrate 412a of the transistor 412 may be connected to the source 406a of the transistor 406. The drain 406c of the transistor 406 may be connected to ground. As similarly described above, at least one transistor 406, which may operate as a substrate body switch for transistor 412, may be provided at the substrate body 412d in accordance with an example body switching technique.

As described earlier, the power handling capability of a transmit switch such as transmit switch 402 may be dependent on the performance (e.g., leakage, voltage breakdown, etc.) of a receiver switch such as receiver switch 404 in an OFF state. Further, the allowance/handling of large voltage swing at antenna port 400, maintenance of high impedance of OFF device (e.g., such as receiver switch 404), and disability of substrate junction diode at negative voltage swing in the receiver switch 404 may be considerations to ensure high power handling capability of a CMOS switch design. According to an example embodiment of the invention, the consideration relating to the large voltage swing at the antenna port 400 may be handled a using multi-stack structure such as that provided by transistors 408, 410, 412. In particular, a voltage swing at the antenna port 400 may be divided among the stacked or cascaded transistors 408, 410, 412. Likewise, according to an embodiment of the invention, the consideration concerning the maintenance of high impedance of OFF device may be improved using a transistor 406 as a body switch, as previously described above.

Figure 4B:
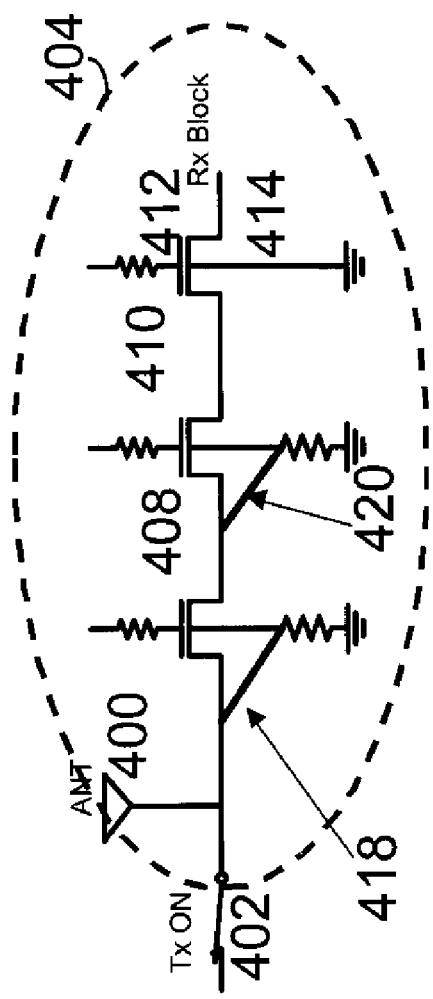
Figure 4C:
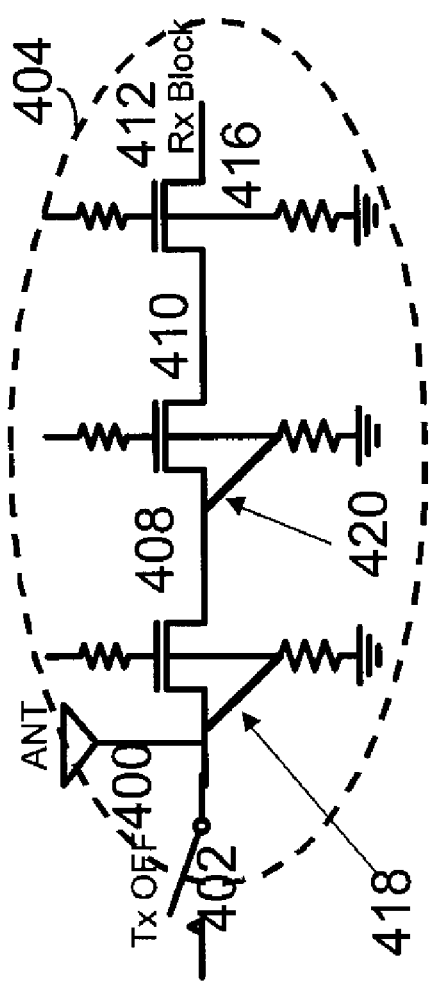

FIGS. 4B and 4C illustrate an operation of a body switch for a receiver switch, according to an example embodiment of the invention. As shown in FIG. 4B, the transistor 406 that operates as a body switch may connect (e.g., short 414) the body substrate 412d to ground, according to an example embodiment of the invention. On the other hand, referring to FIG. 4C, the transistor 406 that operates as a body switch may provide a resistance between the body substrate 412d and ground, thereby providing the transistor 412 in a body floating state, according to an example embodiment of the invention.

It will be appreciated that when negative voltage swing of high power signal is applied, the turning on of substrate junction diodes 204, 206 of OFF device in the receiver switch may be one of the bottlenecks in enhancing power handling capability of CMOS switch. According to an embodiment of the invention, the connections (e.g., connections 418, 420) between either (i) the source and body substrate (e.g., bulk) or (ii) the drain and body substrate (e.g., bulk) while the other port remains in a body floating state, as illustrated in FIG. 4C, may improve power handling capability as well as harmonic performance by manipulating the undesirable leakage current from the substrate junction diode. Indeed, as shown in FIG. 4C, the transistors 408, 412 may include respective electrical connections 418, 420. According to an example embodiment of the invention, the electrical connection 418 may connect the source 408a and substrate body 408d (e.g., the bulk) of transistor 408. Likewise, the electrical connection 420 may connect the source 410a and the substrate body 410d of transistor 410. According to an example embodiment of the invention, the electrical connections 418, 220 may provide a short between the respective sources 408a, 410a and substrate bodies 408d, 410d. However, in other embodiments of the invention, the electrical connection may be implemented with a resistance (e.g., a small resistor) between the a source and a substrate body of a transistor. In another alternative embodiment of the invention, the electrical connections may be provided to connect the drain to the substrate body (e.g., bulk) of a transistor.

It will be appreciated that in a receiver switch 404 with three stacked transistors 408, 410, 412, the source or drain-to-bulk connections 418, 420 may be applied to the first transistor 408 and the second transistor 410 on the antenna 400 side. In an example embodiment of the invention, the third transistor 412, which is closest to the RX block(s), may not include a source or drain-to-bulk connection. Instead, the as described above, the third transistor 412 may include a transistor 406 that operates as a body switch that can place the third transistor 412 in a body floating state, according to an example embodiment of the invention.

Figure 5:
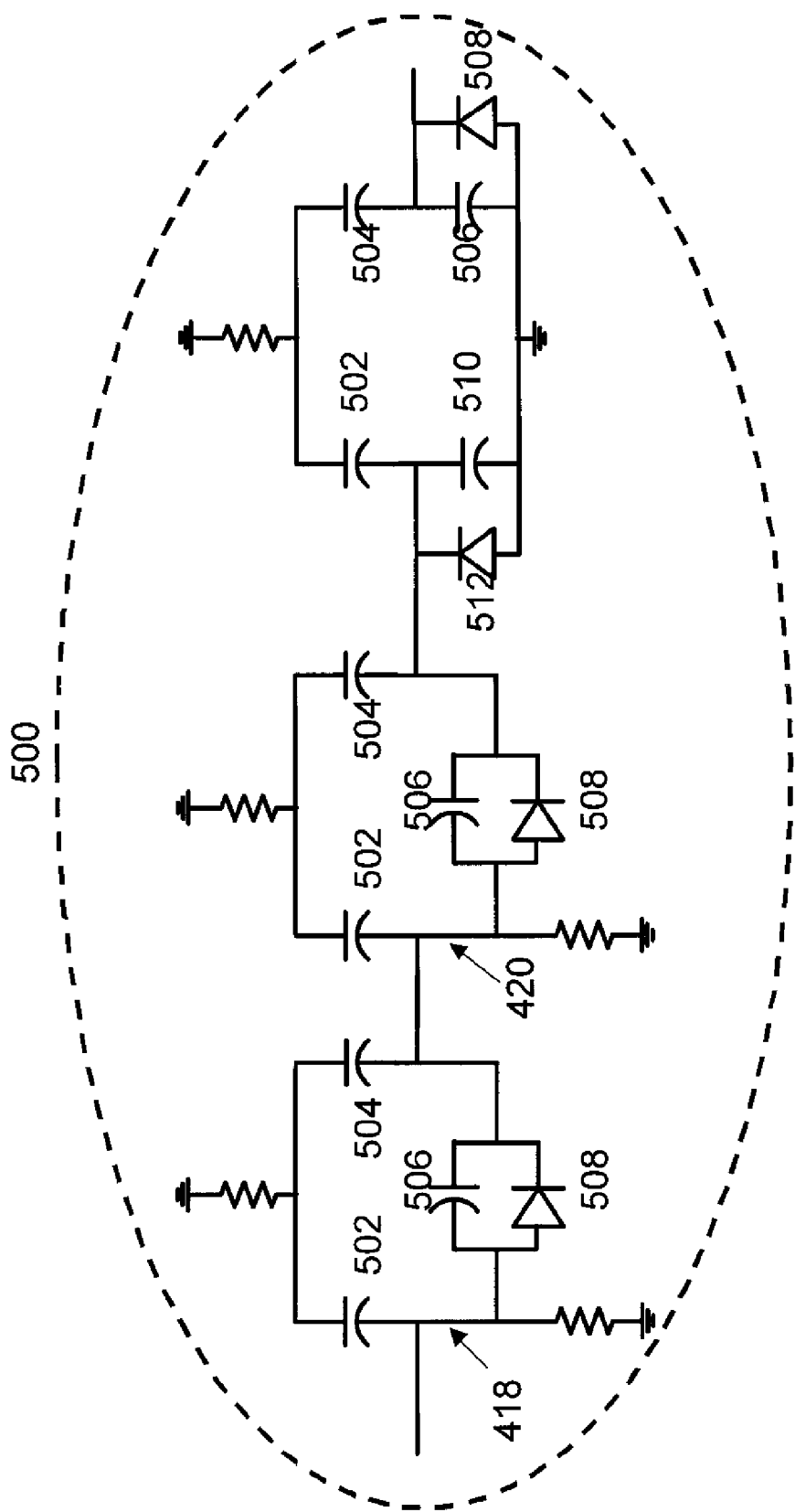
FIG. 5 illustrates a equivalent lumped model of the invention in a multistack structure of receiver switch associated with the example body switching technique, according to an embodiment of the invention.

FIG. 5 illustrates an equivalent lumped elements model 500 of a receiver switch that utilizes both a source or drain to bulk connection with a body floating technique, according to an example embodiment of the invention. Referring back to FIGS. 2A-2B, in the example body floating technique, there may be two junction diodes 204, 206—one for source-to-bulk junction diode 204 and the other for drain-to-bulk junction diode 206. When negative voltage swing with high power is applied to the OFF state CMOS switch, these two diodes 204, 206 may generate undesirable leakage current toward the receive switch in OFF state. FIG. 5 illustrates that if the substrate bulk (e.g., of transistor 408, 410) is connected to either source or drain while the other port (e.g., of transistor 412) unconnected to the body remains in body floating state, one of the junction diodes and one of the junction capacitors in lumped element equivalent model may be disabled. Accordingly, the leakage current in the Rx switch with OFF state can be reduced because of the disability of substrate junction diode which tends to act as a current source at high power voltage swing at antenna port as well as the reduction of the parasitic capacitance in substrate junction, as shown FIG. 5. As a result, power handling capability of the switch which has the connection between source or drain and bulk is higher than the one which has only body floating technique.

III. Simulation Results

Figure 6:
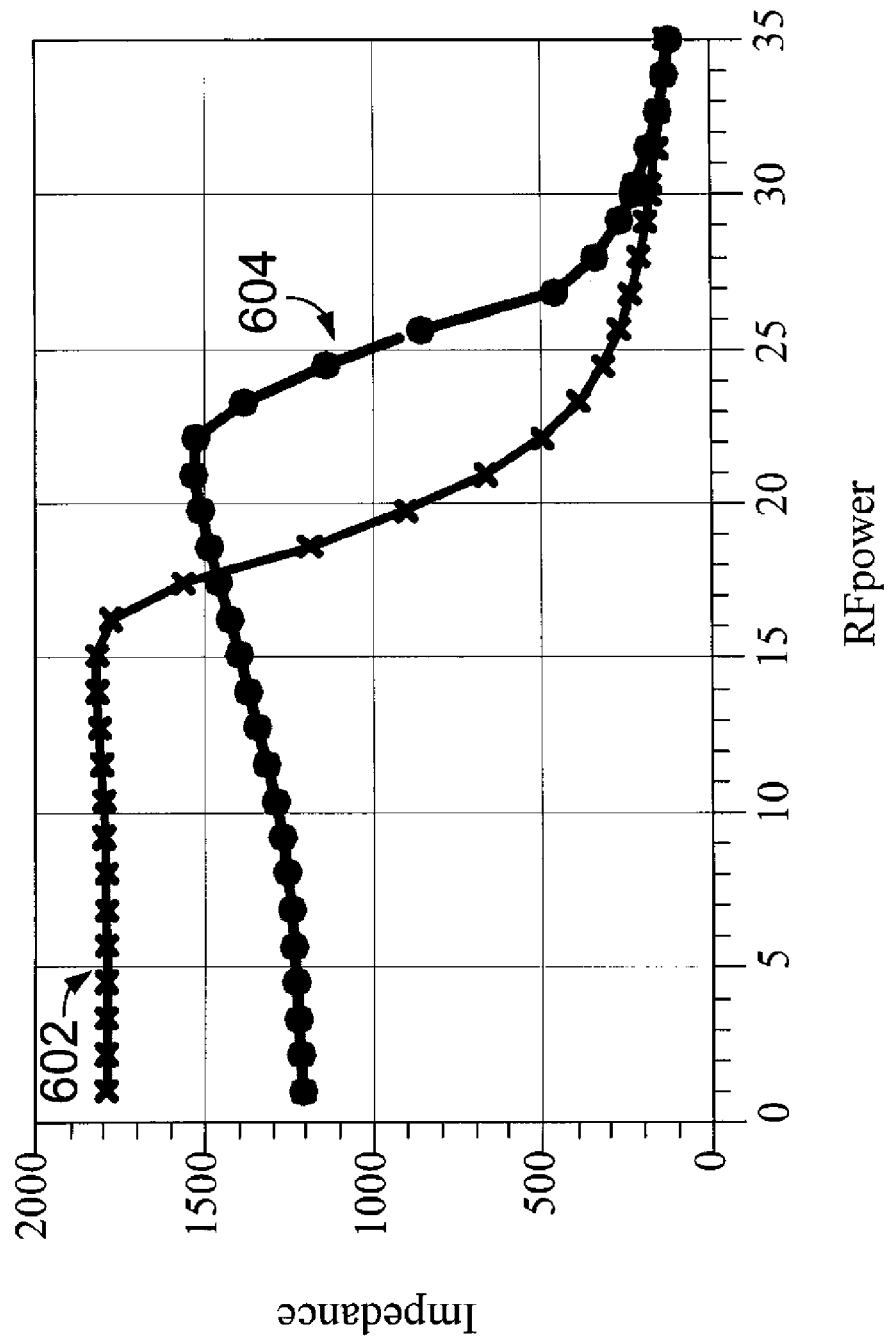
FIG. 6 illustrates an example receiver switch simulation results in terms of impedance of OFF state device according to the input power level with fixed frequency as well as input frequencies with small fixed power, according to an embodiment of the invention.

According to an example embodiment of the invention, FIG. 6 illustrates a first OFF state impedance 602 for a CMOS switch utilizing a body floating technique, as in FIG. 1C, and a second OFF state impedance 604 for a CMOS switch additionally utilizing a source-to-bulk connection technique, as in FIG. 4C. As shown in FIG. 6, the first OFF state impedance 602 and the second OFF state impedance 604 may vary depending on the operating frequency and/or the input power level. According to an example embodiment of the invention, variations in the first OFF state impedance 602 may be due to parasitic capacitances. On the other hand, variations in the second OFF state impedance 604 may be due to the parasitic capacitance and the turning on of the junction diode at negative voltage swing.

In an example embodiment of the invention, the variation of the OFF state impedance of the receiver switch (e.g., receiver switch 404) can affect power handling capability and the harmonic performance at Tx switch (e.g., Tx switch 402). At the small signal simulation which is done by sweeping frequencies with fixed input power, the two different type of structures described above, as in FIGS. 1A and 4A, have almost same OFF state impedance. However, the first OFF state impedance 602 (e.g., CMOS switch using body floating technique) shows different tendency from the second OFF state impedance 604 (e.g., CMOS switch having connection 418, 420 between source and body substrate) in case of the large signal simulation which is done by sweeping input powers with fixed frequency, according to an example embodiment of the invention. In particular, at a higher RF input power, the second OFF state impedance 604 is higher than the first OFF state impedance 602. Thus, a switch utilizing a body source connection may have a higher power handling capability and better harmonic performance than a switch with only a body floating technique because the variation of OFF state impedance drops in a different fashion as the input power increases.

Figure 7:
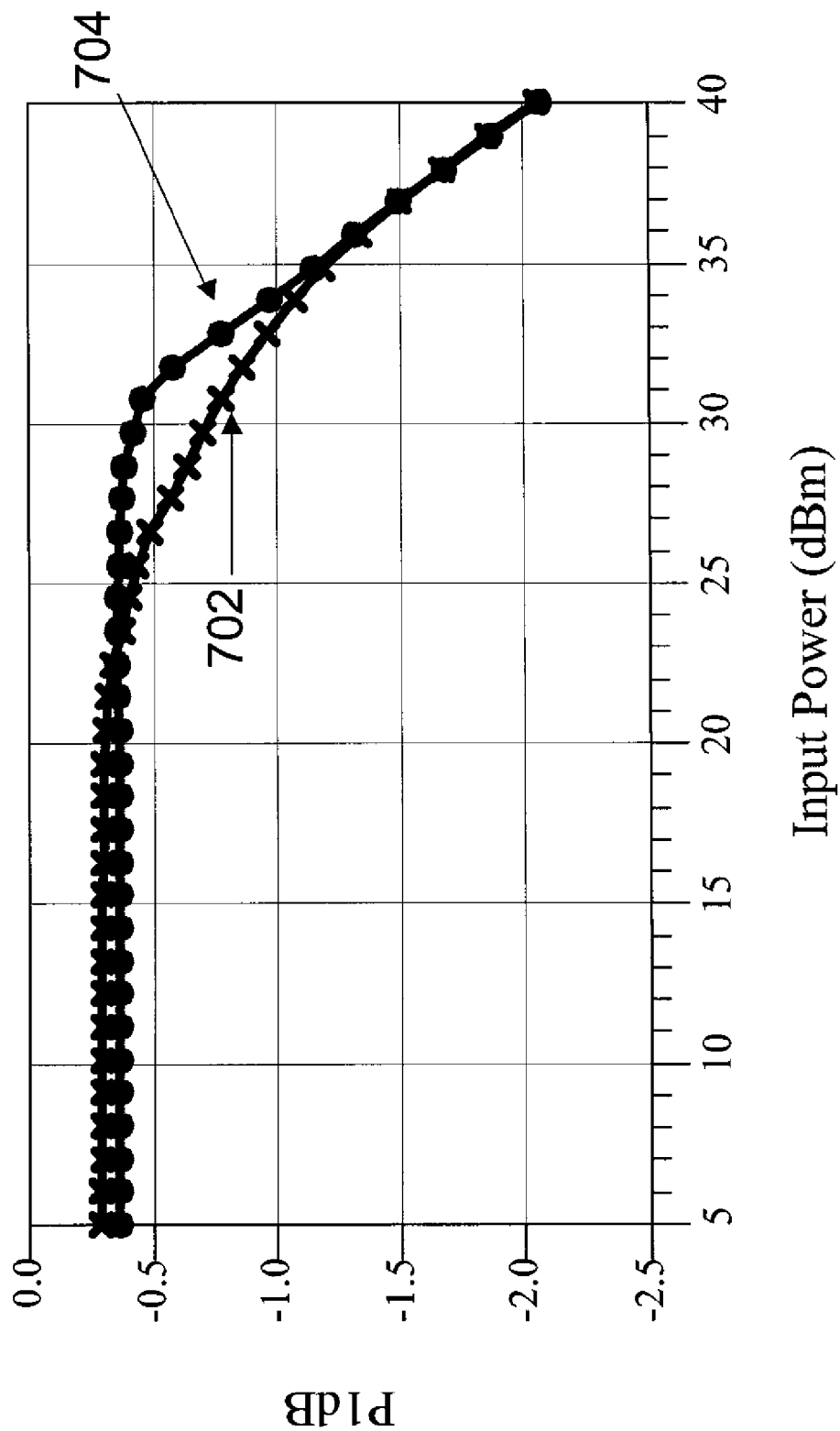
FIG. 7 illustrates example transmit switch simulation results in terms of power handling capability in accordance with an embodiment of the invention.

FIG. 7 illustrates simulation results for the operation of an example multi-band transmit switch, according to an example embodiment of the invention. In particular, FIG. 7 illustrates a first power handling capability 702 in a transmit switch when the receive switch uses a body floating technique, as in FIG. 1A. Likewise, FIG. 7 also illustrates a second power handling capability 704 in a transmit switch when the receive switch uses a source-to-bulk connection technique, as in FIG. 4A.

Figure 8:
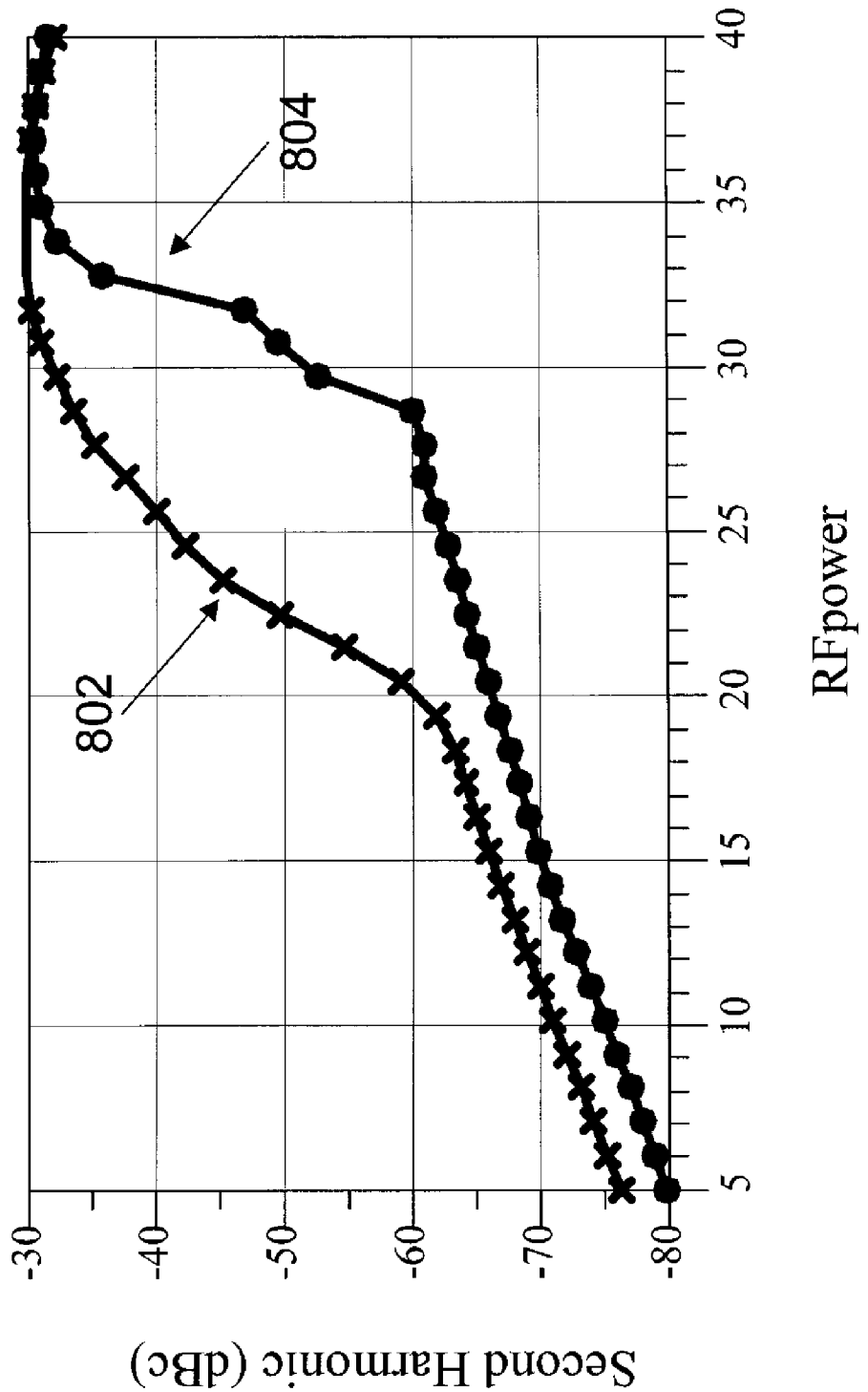
FIG. 8 illustrates example transmit switch simulation results in terms of second harmonic performance in accordance with an embodiment of the invention.

FIG. 8 illustrates simulation results for the operation of an example multi-band transmit switch, according to an example embodiment of the invention. In particular, FIG. 8 illustrates a second harmonic performance 802 for a transmit switch when the receive switch uses a body floating technique, as in FIG. 1A. Likewise, FIG. 8 illustrates a second harmonic performance 804 in a transmit switch when the receive switch uses a source-to-bulk connection technique, as in FIG. 4A.

Figure 9:
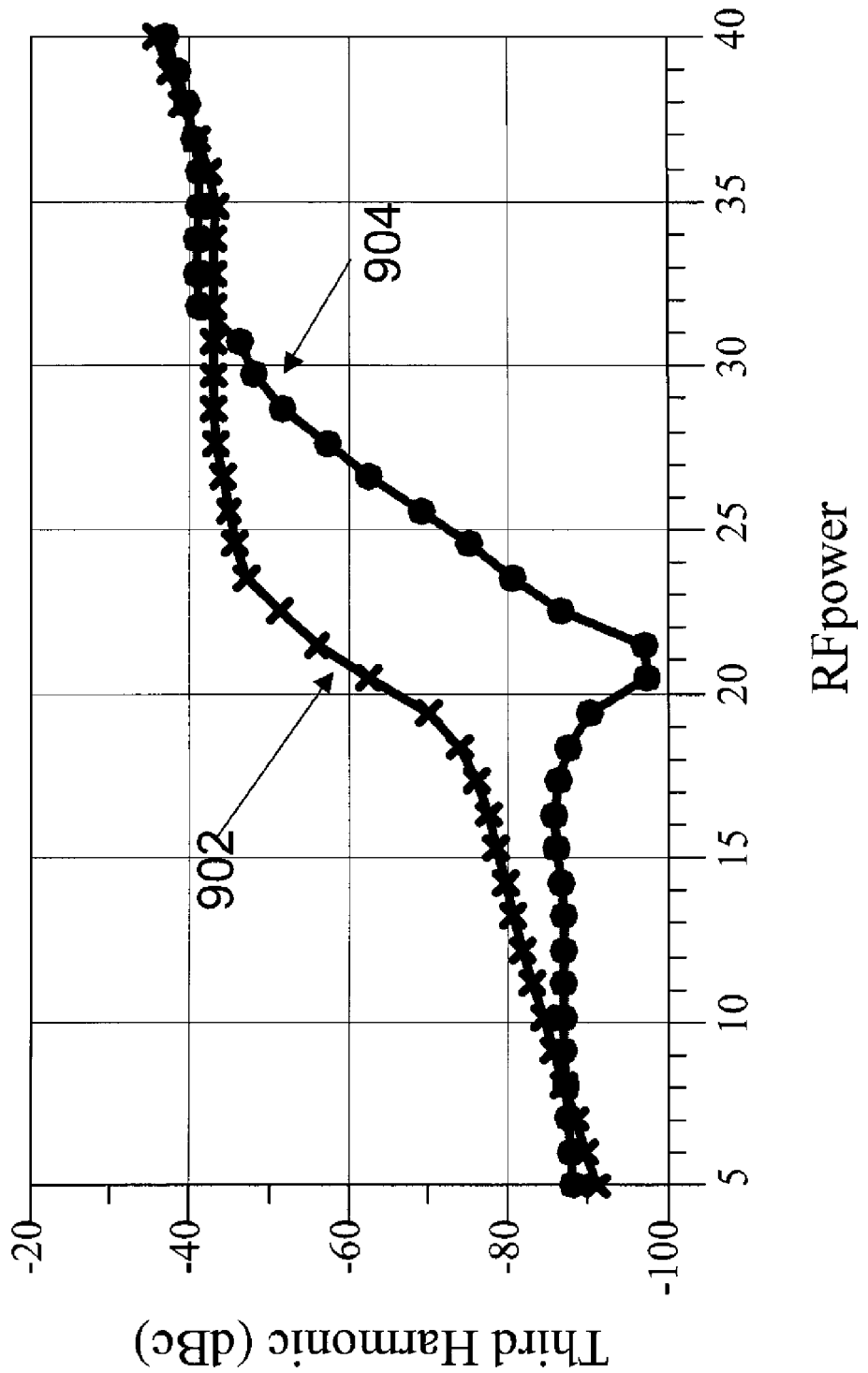
FIG. 9 illustrates example transmit switch simulation results in terms of third harmonic performance in accordance with an embodiment of the invention.

FIG. 9 illustrates simulation results for the operation of an example multi-band transmit switch, according to an example embodiment of the invention. In particular, FIG. 9 illustrates a third harmonic performance 802 for a transmit switch when the receive switch uses a body floating technique, as in FIG. 1A. Likewise, FIG. 9 illustrates a third harmonic performance 904 in a transmit switch when the receive switch uses a source-to-bulk connection technique, as in FIG. 4A.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A CMOS antenna switch, comprising:
an antenna operative at a plurality of radio frequency (RF) bands;
a transmit switch in communication with the antenna; and
a receiver switch in communication with the antenna, wherein the receiver switch includes a plurality of transistors, including a first transistor and a second transistor, wherein the first transistor includes a first source, a first drain, and a first body substrate, wherein the second transistor includes a second source, a second drain, and a second body substrate, wherein the first body substrate is electrically connected to the first source or the first drain, and wherein the second body substrate is selectively connectable between a resistance and ground, and wherein the plurality of transistors further includes a body substrate switch for selectively connecting the second body substrate between the resistance and ground.

2. The antenna switch of claim 1, wherein the first drain is connected to the second source, and wherein the second drain is connected to at least one receive block.

3. The antenna switch of claim 2, wherein the plurality of transistors comprises a third transistor having a third source, a third drain, and a third body substrate, wherein the third body substrate is electrically connected to the third source or the third drain, and wherein the third drain is electrically connected to the first source.

4. The antenna switch of claim 1, wherein the resistance includes an OFF-state resistance of the body substrate switch.

5. The antenna switch of claim 1, wherein the second body substrate includes a third source and a third drain, wherein the third source is connected to the second body substrate, and wherein the third drain is connected to ground.

6. The antenna switch of claim 1, wherein during a transmit (Tx) mode, the transmit switch is enabled, the receiver switch is disabled, and the body substrate switch is enabled to connect the second body substrate to ground, thereby minimizing leakage current for preventing channel formation in the receiver switch.

7. The antenna switch of claim 1, wherein during a receive (Rx) mode, the transmit switch is disabled, the receiver switch is enabled, and the body substrate switch is disabled to provide the resistance between the second body substrate and ground, thereby forming a signal path for a receive signal.

8. The antenna switch of claim 1, wherein the plurality of transistors comprise Complementary Metal Oxide Semiconductor (CMOS) transistors that are cascaded together.

9. The antenna switch of claim 1, wherein the first transistor having the first body substrate that is electrically connected to the first source or the first drain is nearest to the antenna.

10. A method for a CMOS antenna switch, comprising:
providing an antenna operative at a plurality of radio frequency bands;
electrically connecting a transmit switch and a receiver switch to the antenna, wherein the receiver switch comprises a plurality of transistors, including a first transistor and a second transistor, wherein the first transistor includes a first source, a first drain, and a first body substrate, and wherein the second transistor includes a second source, a second drain, and a second body substrate;
electrically connecting the first body substrate to the first source or the first drain; and
selectively connecting the second body substrate between a resistance and ground, wherein the second body substrate is selectively connected between a resistance and ground using a body substrate switch.

11. The method of claim 10, wherein the first drain is connected to the second source, and wherein the second drain is connected to at least one receive block.

12. The method of claim 11, wherein the plurality of transistors comprises a third transistor having a third source, a third drain, and a third body substrate, and further comprising:
electrically connecting the third body substrate to the third source or the third drain, and wherein the third drain is electrically connected to the first source.

13. The method of claim 10, wherein the resistance includes an OFF-state resistance of the body substrate switch.

14. The method of claim 10, wherein the second body substrate includes a third source and a third drain, wherein the third source is connected to the second body substrate, and wherein the third drain is connected to ground.

15. The method of claim 10, wherein during a transmit (Tx) mode, the transmit switch is enabled, the receiver switch is disabled, and the body substrate switch is enabled to connect the second body substrate to ground, thereby minimizing leakage current for preventing channel formation in the receiver switch.

16. The method of claim 10, wherein during a receive (Rx) mode, the transmit switch is disabled, the receiver switch is enabled, and the body substrate switch is disabled to provide the resistance between the second body substrate and ground, thereby forming a signal path for a receive signal.

17. The method of claim 10, wherein the plurality of transistors comprise Complementary Metal Oxide Semiconductor (CMOS) transistors that are cascaded together.

18. The method of claim 10, wherein the first transistor having the first body substrate that is electrically connected to the first source or the first drain is nearest to the antenna.

* * * * *